(12) United States Patent
Takahashi et al.

(10) Patent No.: US 10,084,388 B2
(45) Date of Patent: Sep. 25, 2018

(54) POWER CONVERSION DEVICE

(71) Applicant: Mitsubishi Electric Corporation, Chiyoda-ku (JP)

(72) Inventors: Keita Takahashi, Chiyoda-ku (JP);
Kazuki Sakata, Chiyoda-ku (JP);
Yoshiyuki Deguchi, Chiyoda-ku (JP);
Takuto Yano, Chiyoda-ku (JP);
Mamoru Takikita, Chiyoda-ku (JP);
Kazutoshi Awane, Chiyoda-ku (JP);
Koji Nakajima, Chiyoda-ku (JP);
Takao Mitsui, Chiyoda-ku (JP);
Kosuke Nakano, Chiyoda-ku (JP);
Masayoshi Tamura, Chiyoda-ku (JP);
Masashi Sakai, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/325,949

(22) PCT Filed: Jun. 12, 2015

(86) PCT No.: PCT/JP2015/067043
§ 371 (c)(1),
(2) Date: Jan. 12, 2017

(87) PCT Pub. No.: WO2016/027557
PCT Pub. Date: Feb. 25, 2016

(65) Prior Publication Data
US 2017/0194873 A1 Jul. 6, 2017

(30) Foreign Application Priority Data

Aug. 22, 2014 (JP) .................................. 2014-169360

(51) Int. Cl.
*H02M 7/00* (2006.01)
*H02M 7/537* (2006.01)
(Continued)

(52) U.S. Cl.
CPC ........ *H02M 7/003* (2013.01); *H01L 23/3675* (2013.01); *H01L 23/552* (2013.01);
(Continued)

(58) Field of Classification Search
CPC ..... H03H 1/00; H02M 7/003; H01L 23/3675; H05K 7/209; H01G 4/30; H01G 4/232; H01G 4/01; H01G 9/0032; H01G 9/07
(Continued)

(56) References Cited

U.S. PATENT DOCUMENTS 4,401,955 A * 8/1983 Yorinks ..................... H01P 5/12
333/127
5,936,839 A * 8/1999 Saito ..................... H05K 9/0049
174/16.3
(Continued)

FOREIGN PATENT DOCUMENTS

| JP | 2005-183574 A | 7/2005 |
| JP | 2005-341643 A | 12/2005 |

(Continued)

OTHER PUBLICATIONS

International Search Report dated Aug. 25, 2015 in PCT/JP15/067043 Filed Jun. 12, 2015.
(Continued)

*Primary Examiner* — Mandeep S Buttar
(74) *Attorney, Agent, or Firm* — Oblon, McClelland, Maier & Neustadt, L.L.P.

(57) ABSTRACT

A power converter includes: a base conductor, an electrically heating member which is provided on the base conductor, a noise reduction capacitor of flat plate-shape in which via an
(Continued)

insulator, a plurality of first electrodes and second electrodes are alternately layered, on one surface, the first electrode in an outermost layer is exposed and on another surface, the second electrode in an outermost layer is exposed, a relay conductor which is electrically connected to other members from the electrically heating member via the noise reduction capacitor, and the second electrode in an outermost layer of the noise reduction capacitor is face-joined to a face of the base conductor at a side where the electrically heating member is provided and the first electrode in an outermost layer and the relay conductor are face-joined.

9 Claims, 14 Drawing Sheets

(51) Int. Cl.
   *H01L 23/552* (2006.01)
   *H05K 7/20* (2006.01)
   *H01L 23/367* (2006.01)
   *H03H 1/00* (2006.01)
   *H01L 25/18* (2006.01)

(52) U.S. Cl.
   CPC ............ *H01L 25/18* (2013.01); *H02M 7/537* (2013.01); *H03H 1/00* (2013.01); *H05K 7/209* (2013.01); *H03H 2001/0085* (2013.01)

(58) Field of Classification Search
   USPC ............... 361/707, 306.3, 321.2, 301.4, 313; 174/260; 363/40, 43, 132, 131
   See application file for complete search history.

(56) References Cited

U.S. PATENT DOCUMENTS

| | | | |
|---|---|---|---|
| 2007/0057284 A1* | 3/2007 | Casey | H01L 23/3675 257/177 |
| 2008/0049476 A1 | 2/2008 | Azuma et al. | |
| 2009/0154112 A1* | 6/2009 | Fan | H05K 1/141 361/719 |
| 2010/0157640 A1 | 6/2010 | Azuma et al. | |
| 2011/0057713 A1 | 3/2011 | Kawanami et al. | |
| 2014/0238731 A1* | 8/2014 | Kelley | H05K 3/0014 174/258 |
| 2016/0315038 A1* | 10/2016 | Sato | H01L 25/00 |

FOREIGN PATENT DOCUMENTS

| | | |
|---|---|---|
| JP | 2008-4953 A | 1/2008 |
| JP | 2008-29117 A | 2/2008 |
| JP | 2010-252460 A | 11/2010 |
| JP | 2013-106503 A | 5/2013 |
| JP | 2013-219919 A | 10/2013 |
| JP | 2014-013884 A | 1/2014 |
| JP | 2014-17365 A | 1/2014 |
| JP | 2014-128066 A | 7/2014 |
| WO | 2009/150875 A1 | 12/2009 |

OTHER PUBLICATIONS

Extended European Search Report dated Mar. 15, 2018 in corresponding European Patent Application No. 15833982.0 citing documents AO, AP, AQ and AR therein, 8 pages.

\* cited by examiner

POWER CONVERSION DEVICE

TECHNICAL FIELD

This invention relates to a power convertor which includes a noise reduction capacitor.

BACKGROUND ART

There is a case such that in order to reduce a noise which is generated in accordance with switching operation of a semiconductor module, in the immediate vicinity of a semiconductor module, a junction between a terminal of a semiconductor module and a base conductor which functions also as a heat radiator is connected by a noise reduction capacitor. Especially, in a case where a SiC element is used as a semiconductor element, generally, a noise which is generated by a semiconductor module is increased, therefore, necessity of reducing a noise in the immediate vicinity of a semiconductor is increased so as not to conduct a noise to outside the semiconductor module.

Patent Document 1 discloses such that a noise can be reduced by mounting a filter capacitor in a semiconductor module so as to connect with a base which functions also as a heat sink Patent Document 2 discloses such that a ground conductor on which a semiconductor module is mounted is extended, a first insulator is sandwiched between a positive pole conductor and a ground conductor, a second insulator is sandwiched between a negative pole conductor and a ground conductor so as to form a Y capacitor, as a result, a noise can be reduced.

Further, there is a case such that in order to suppress increase of a temperature of a smoothing capacitor which is connected to a semiconductor module due to heating of a semiconductor module, a semiconductor module terminal is thermally contacted with a heat radiator. Generally, modules are thermally designed on conditions such that heat resistance temperature of a Si element does not exceed approximately 150 degrees Celsius, however in a case where a SiC element is used as a semiconductor element, in some cases, a semiconductor module is thermally designed on conditions such that a semiconductor module becomes a temperature higher than 200 degrees Celsius. A temperature of a smoothing capacitor is approximately 125 degrees Celsius at highest, even when a thermal design of a semiconductor module is achieved, heat is conducted from a semiconductor module to a smoothing capacitor, and there is a problem such that a temperature of a smoothing capacitor exceeds an upper limit temperature. Therefore, necessity to sufficiently cool a joint between a semiconductor module and a smoothing capacitor is increased. Patent Document 3 discloses such that via an insulator, by fixing a junction between a semiconductor module terminal and a smoothing capacitor terminal to a cooling device, temperature increase of a smoothing capacitor can be suppressed.

PRIOR ART REFERENCE

Patent Document

[Patent Document 1] Japanese Patent Application Laid-Open No. 2008-4953
[Patent Document 2] Japanese Patent Application Laid-Open No. 2013-219919
[Patent Document 3] Japanese Patent Application Laid-Open No. 2010-252460

DISCLOSURE OF THE INVENTION

Problems to be Solved by the Invention

According to a power converter which is disclosed by Patent Document 1, a filter capacitor is mounted on a base which also functions as a heat sink, however, as shown in a figure of Patent Document 1, a joint between a filter capacitor and a lead frame in a semiconductor module is generally connected by a lead wire such as an aluminum wire, therefore there is a problem such that due to inductance of a lead wire, noise reduction performance of a filter capacitor is decreased. Further, generally, thermal resistance of an aluminum wire is higher than that of a lead frame, therefore, heat of a lead frame can not be radiated to a base. Consequently, it is necessary to provide a heat radiating for a lead frame separately, as a result, there is a problem such that a size of a device becomes large.

According to a power converter which is disclosed by Patent Document 2, by sandwiching an insulator between a positive pole conductor and negative pole conductor which are connected to a module and a ground conductor on which a module is mounted, a leadless capacitor is formed so as to suppress decrease of noise reduction performance due to inductance of a lead wire. However, when capacity of a capacitor is intended to increase in order to obtain sufficient noise reduction performance, it is necessary to extend a positive pole conductor, a negative pole conductor and a ground conductor, therefore, a size of a device becomes large. Further, cooling of a positive pole conductor and a negative pole conductor is not considered, therefore, it is necessary to provide a heat radiating for a positive pole conductor and a negative pole conductor separately, and as a result, there is a problem such that a size of a device becomes larger.

A power converter which is disclosed by Patent Document 3 is configured such that for radiating heat which is generated by a semiconductor module, a junction between a semiconductor module terminal and a smoothing capacitor terminal is fixed to a cooling equipment via an insulator by pressuring with a screw which penetrates the insulator. In Patent Document 3, regarding an insulator, only heat radiation is focused, and in a case where an insulator is applied to a circuit which requires noise reduction, it is necessary to provide a noise reduction capacitor, therefore, there is a problem such that a size of a device becomes large.

This invention is made so as to solve the above mentioned problem, and aims to provide a power converter whose size is smaller than that of a power converter in which a noise reduction capacitor and cooling member for cooling a relay conductor are separately provided, and which can realize noise reduction and cooling of a relay conductor.

Means for Solving the Problems

According to this invention, a power converter comprises a base conductor, an electrically heating member which is provided on the base conductor, a noise reduction capacitor of flat plate-shape in which via an insulator, a plurality of first electrodes and second electrodes are alternately layered, on one surface, the first electrode in an outermost layer is exposed and on another surface, the second electrode in an outermost layer is exposed, and a relay conductor of plate-shape which is electrically connected to other members from the electrically heating member via the noise reduction capacitor, and the second electrode in an outermost layer of the noise reduction capacitor is face-joined to a face of the base conductor at a side where the electrically heating member is provided and the first electrode in an outermost layer and the relay conductor are face-joined.

Advantage of the Invention

According to this invention, a noise reduction capacitor has not only a noise reduction function but also a function of radiating heat which is generated by a relay conductor, as a result, a power converter whose size is smaller than that of a power converter in which a noise reduction capacitor and cooling member for cooling a relay conductor are separately provided, and which can realize noise reduction and cooling of a relay conductor can be provided.

MODE FOR CARRYING OUT THE INVENTION

Figure 1:
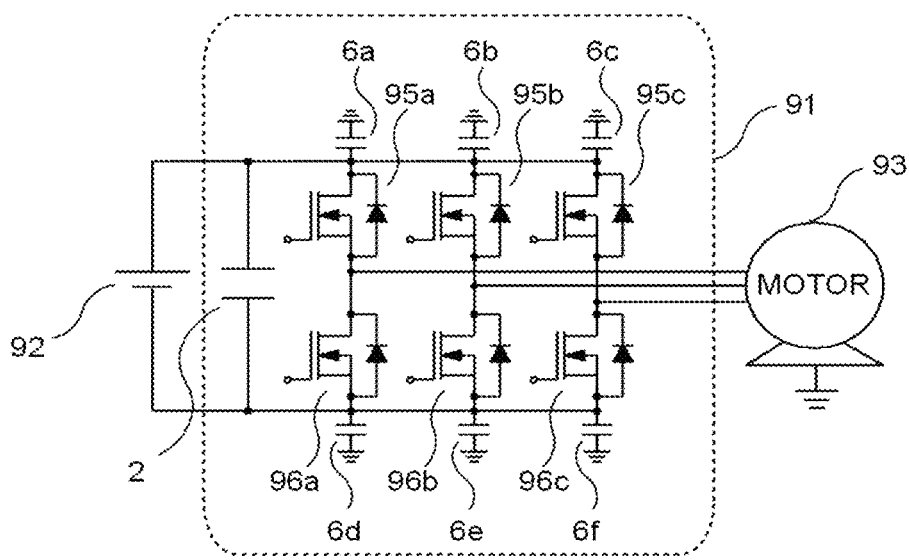
FIG. 1 is a schematic circuit diagram showing one example of a power converter according to Embodiment 1 of this invention.

As disclosed in Patent Documents 1, 2 and 3, conventionally, regarding a noise reduction capacitor, a noise reduction function and a heat radiating function of heat radiation from a conductor as a wiring member which is taken out from a heating element are considered separately and designed. According to this invention, based on new idea such that both of a noise reduction function and a heat radiation function from a wiring member, which are separately considered conventionally, are combined, a noise reduction capacitor is positively constituted to have a function of heat radiation. Hereinafter, embodiments of this invention based on the above-mentioned idea will be described.

Embodiment 1

First, referring to FIGS. 1 to 5, a power converter according to Embodiment 1 of this invention will be described. First, referring to FIG. 1, one example of a schematic circuit diagram of a power converter 91 according to Embodiment 1 will be described. The power converter 91 according to Embodiment 1 can convert a direct current which is inputted by a direct current power source 92 into an alternating current so as to supply an alternating current to a motor 93, etc. Here, a smoothing capacitor 2 has a function for smoothing a voltage between a positive pole and a negative pole which variates in accordance with an operation of the power converter 91 and is connected to the direct current power source 92 in parallel. The power converter 91, for example, as an inverter, comprises three semi-bridge circuits which are connected in parallel. Concretely, semiconductor elements of upper arm 95a, 95b, 95c (in some cases, 95a, 95b and 95c are collectively indicated as 95, alternatively, any one of 95a, 95b and 95c is indicated as 95. Following characters to which a letter of alphabet is given are indicated in the same way) and semiconductor elements of lower arm 96a, 96b, 96c are provided. The semiconductor elements 95a and 96a are connected in series so as to constitute a first semi-bridge circuit. The semiconductor elements 95b and 96b are connected in series so as to constitute a second semi-bridge circuit. The semiconductor elements 95c and 96c are connected in series so as to constitute a third semi-bridge circuit. The first semi-bridge circuit, the second semi-bridge circuit and the third semi-bridge circuit are connected in parallel so as to constitute a three-phase inverter circuit.

Each semiconductor element 95 or 96 may be an arbitrary semiconductor element such as an insulated-gate bipolar transistor (IGBT) and a thyristor, for example, MOS type field effect transistor (MOSFET). Diodes are connected to each of semiconductor elements in parallel, individually. A diode may be a PN-junction diode or a Schottky barrier type diode, and a parasitic diode in MOSFET may be utilized. A drain side of the semiconductor element 95 of upper arm is connected to a positive pole side of the direct current power source 92 and a positive pole side terminal of the smoothing capacitor 2, and a source side of the semiconductor element 96 of lower arms is connected to a negative pole side of the direct current power source 92 and a negative pole side terminal of the smoothing capacitor 2. A junction between the semiconductor element 95 of upper arm and the semiconductor element 96 of lower arm is connected to a motor 53. Each semi-bridge circuit of the power converter 91 is constituted as a semiconductor module 1. Noise reduction capacitors 6a, 6b and 6c are connected to a part between a positive pole side and a ground of each semi-bridge circuit. Further, noise reduction capacitors 6d, 6e and 6f are connected to a part between a negative pole side and a ground of each semi-bridge circuit.

Further, this invention is especially effective to a semiconductor module which is formed of a wide bandgap semiconductor whose band gap is larger than that of Si (silicon) such as SiC, etc. as a semiconductor element which is provided in the semiconductor module 1. A material of a wide bandgap semiconductor includes SiC (silicon carbide), a gallium nitride based material or diamond, for example. In a case where the wide bandgap semiconductor is used as a power conversion element for a power converter, generally, switching speed is fast, therefore, noise which is generated by a semiconductor module is large. Consequently, it is necessary to increase the noise reduction effect of a noise reduction capacitor as much as possible. Further, in comparison with a Si semiconductor, a wide bandgap semiconductor can be operated at higher temperatures, therefore, thermal effect with respect to other components is larger, and consequently, a heat radiation design becomes important. As above mentioned, in a case where a semiconductor element which is formed of a wide bandgap semiconductor is used for a power converter, enhancing both of noise reduction and heat radiation becomes important.

Figure 2:
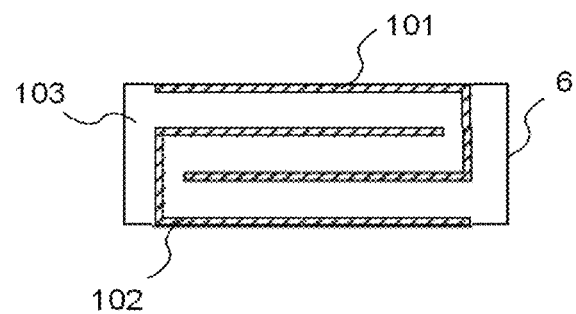
FIG. 2 is a section view showing one example of the configuration of a noise reduction capacitor of a power converter according to Embodiment 1 of this invention.
Figure 3:
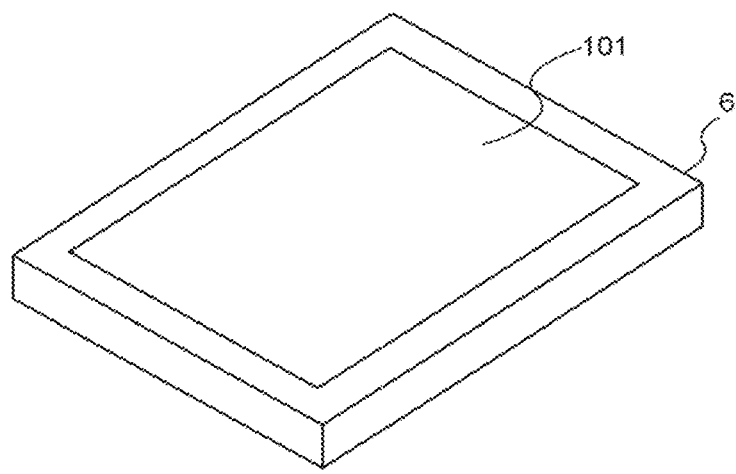
FIG. 3 is a perspective view showing one example of a noise reduction capacitor of a power converter according to Embodiment 1 of this invention.

FIG. 2 is a schematic section view for describing the inner configuration of a noise reduction capacitor 6 which is mounted in the power converter 91. FIG. 3 is a perspective view showing a noise reduction capacitor 6. As shown in FIG. 2, the noise reduction capacitor 6 has the configuration in which a plurality of layers of a first electrode 101 and a second electrode 102 are alternately layered via an insulator 103. Concretely, one layer of the first electrode 101 is arranged on an upper surface of the noise reduction capacitor 6 and another layer of the first electrode 101 is arranged inside the noise reduction capacitor 6. One layer of the second electrode 102 is arranged on a bottom surface of the noise reduction capacitor 6 and another layer of the second electrode 102 is arranged inside the noise reduction capacitor 6. As shown in FIG. 3, the noise reduction capacitor 6 is flat plate-shaped and is arranged so as for the first electrode 101 to be exposed to an upper surface. Here, in order to secure cooling capacity, an area for one layer of the first electrode 1 is set to be preferably 50 mm$^2$ or more. Further, when a thickness of a noise reduction capacitor with respect to the above-mentioned area is thick, thermal resistance becomes large, therefore, a noise reduction capacitor is made to be a flat plate-shaped in which a ratio of thickness of whole of a noise reduction capacitor with respect to an area per one layer of the first electrode 101 is 0.02 mm/mm$^2$ or less.

Figure 4:
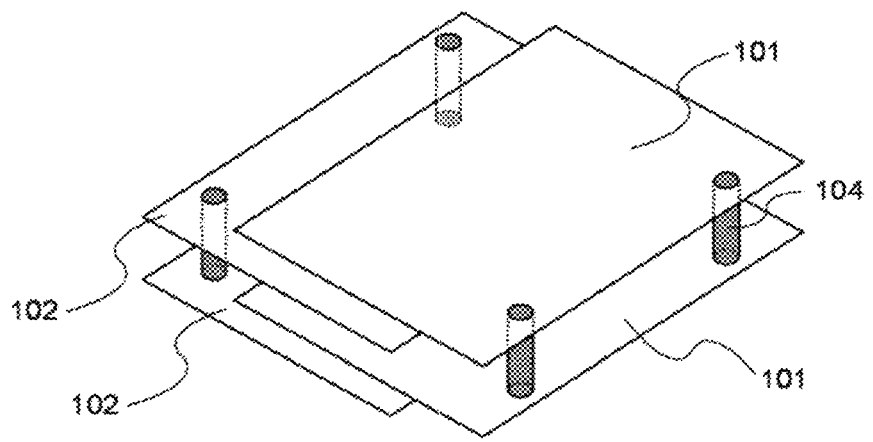
FIG. 4 is a perspective view showing one example of the inner configuration of a noise reduction capacitor of a power converter according to Embodiment 1 of this invention.
Figure 5:
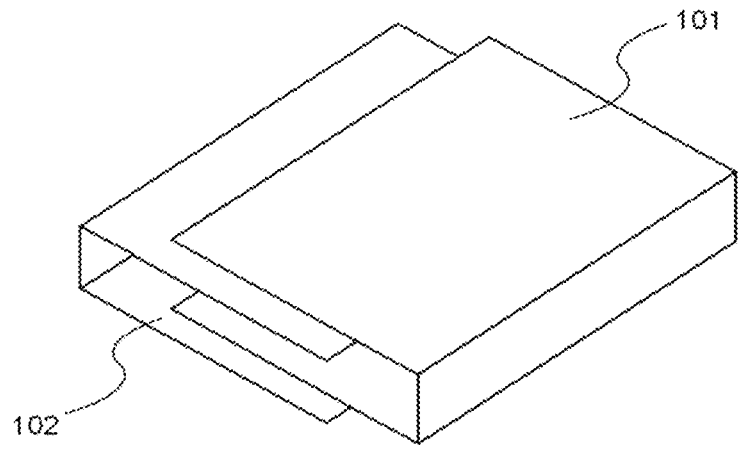
FIG. 5 is a perspective view showing another example of the inner configuration of a noise reduction capacitor of a power converter according to Embodiment 1 of this invention.

FIG. 4 is a perspective view showing the inner configuration of the noise reduction capacitor 6 in which the insulator 103 is omitted. As shown in FIG. 4, the first electrodes 101 are alternately connected by interlayer connection conductors 104, and the second electrodes 102 are also alternately connected by the interlayer connection conductors 104. The noise reduction capacitor 6 is a print substrate, for example, as the insulator 103, an epoxy resin or a PPE resin may be used, as the first electrode 101 or the second electrode 102, a copper pattern may be used and the interlayer connection conductor 104, a via, etc. may be used. Here, the interlayer connection conductor 104 is used for connecting layers, however, as shown in FIG. 5, the first electrode 101 and the second electrode 102 are formed to be an U shape so as to electrically connect the same electrodes.

Figure 6:
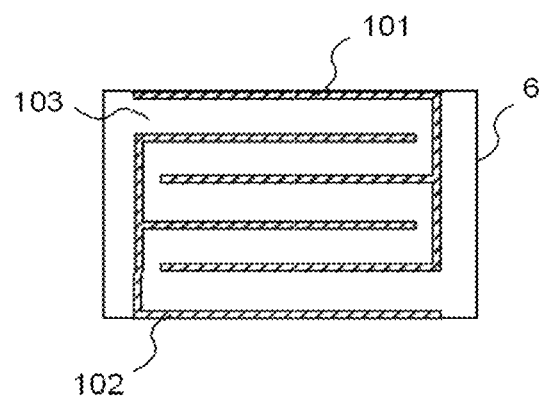
FIG. 6 is a section view showing another example of the inner configuration of a noise reduction capacitor of a power converter according to Embodiment 1 of this invention.

In the above-mentioned, an example of the noise reduction capacitor 6 having two layers of the first electrode 101 and the second electrode 102, individually is described, however, as shown in FIG. 6, the noise reduction capacitor 6 may have three layers of the first electrode 101 and the second electrode 102, individually. In this case, one layer of the first electrode 101 is arranged on an upper surface of the noise reduction capacitor 6 and two layers of the first electrode 101 are arranged inside the noise reduction capacitor 6. One layer of the second electrode 102 is arranged on a bottom surface of the noise reduction capacitor 6 and two layers of the second electrode 102 are arranged inside the noise reduction capacitor 6. As shown in FIG. 6, by having three layers of the first electrode 101 and the second electrode 102, individually, a capacitor whose area is the same as that of the noise reduction capacitor 6 shown in FIG. 2 can have more capacity, as a result, noise reduction effect can be improved. Further, the number of layers of the first electrode 101 and the second electrode 102 is not limited to two layers or three layers, and further more layers may have. However, in order to secure cooling capacity, an area for one layer of the first electrode 1 is set to be preferably 50 mm$^2$ or more. Further, when a thickness of a noise reduction capacitor with respect to the above-mentioned area is thick, thermal resistance becomes large, therefore, a noise reduction capacitor is made to be a flat plate-shaped in which a ratio of thickness of whole of a noise reduction capacitor with respect to an area per one layer of the first electrode 101 is 0.02 mm/mm$^2$ or less.

As above mentioned, the noise reduction capacitor 6 is constituted to be flat plate-shaped in which via an insulator, the first electrodes and second electrodes are alternately layered and an outermost layer of the first electrodes is exposed to a surface and an outermost layer of the second electrode is exposed to another surface.

Electrostatic capacity of the noise reduction capacitor 6 is increased so as to improve noise reduction effect, therefore, as the insulator 103, it is preferable to use a material having high permittivity, in addition to a resin, a ceramic such as a titanium oxide, barium titanate, etc., may be used. Further, a resin having high permittivity to which a ceramic filler is added may be used. Further, in order to reduce thermal resistance of the noise reduction capacitor 6, as the insulator 103, it is preferable to use a material having high thermal conductivity, and a resin to which a heat conduction filler is added may be used.

Figure 7:
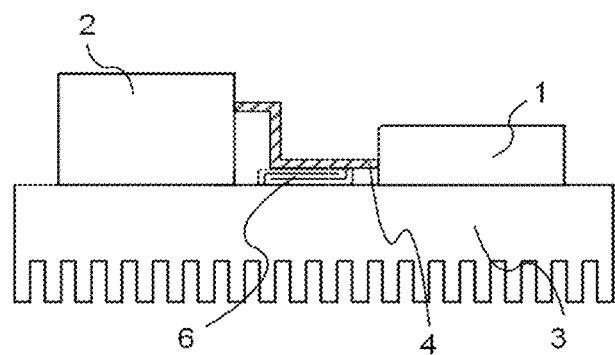
FIG. 7 is a section view showing one example of the configuration of a power converter according to Embodiment 1 of this invention.
Figure 8:
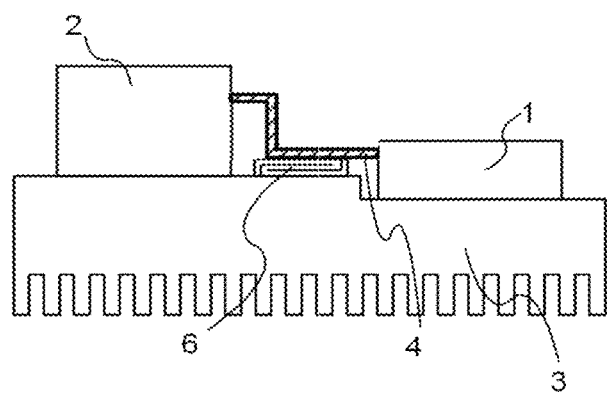
FIG. 8 is a section view showing another example of the configuration of a power converter according to Embodiment 1 of this invention.

FIG. 7 and FIG. 8 are schematic section views for describing the inner configuration of a power converter. As shown in FIG. 7, the semiconductor module 1 and the smoothing capacitor 2 are mounted on the base conductor 3 which also functions as a heat radiator, by the relay conductor 4, the semiconductor module 1 and the smoothing capacitor 2 are connected. The relay conductor 4 is connected to the first electrode 101 on an upper surface of the noise reduction capacitor 6 with solder, and the base conductor 3 is connected to the second electrode 102 on a bottom surface of the noise reduction capacitor 6 with solder. Further, as shown in FIG. 8, the base conductor 3 may have a step height, and there may be a step height between the semiconductor module 1 and the noise reduction capacitor 6.

Figure 9:
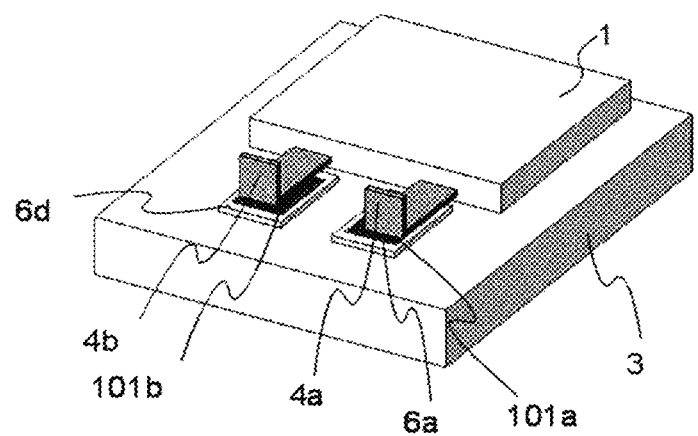
FIG. 9 is a perspective view showing one example of the configuration of a power converter, whose one part is omitted, according to Embodiment 1 of this invention.

FIG. 9 is a perspective view showing the state in which a noise reduction capacitor is mounted on a power converter. In order to make FIG. 9 easy to visually see, a part on which the smoothing capacitor 2 is mounted is omitted and depicted. A positive pole side relay conductor 4a, a negative pole side relay conductor 4b, a positive pole side noise reduction capacitor 6a and a negative pole side noise reduction capacitor 6d are provided, and the positive pole side relay conductor 4a and a positive pole side first electrode which is exposed to an upper surface of the positive pole side noise reduction capacitor 6a are electrically face-joined, and the negative pole side relay conductor 4b and a negative pole side first electrode which is exposed to an upper surface of the negative pole noise reduction capacitor 6d are electrically face-joined. Further in FIG. 7 and FIG. 8, only one of the positive pole side relay conductor 4a and the negative pole side relay conductor 4b is depicted as the relay conductor 4, and only one of the positive pole side noise reduction capacitor 6a and the negative pole side noise reduction capacitor 6d is depicted as the noise reduction capacitor 6.

The base conductor 3 is an aluminum, for example, an air-cooled heat radiation fan or a water-cooled cooling path is provided, and has a function for cooling heat of members which are mounted on the base conductor 3. The relay conductor 4 is a plate-shaped flat rectangular copper wire, however, a wire which is excellent in flexibility such as a flat rectangular wire in which plate-shaped conductors are layered or a flat rectangular wire which is made by forming a net wire into a plate shape may be used. Here, the plate-shaped relay conductor 4 and a first electrode are face-joined. Further, the base conductor 3 and the second electrode 102 are face-joined. In the above-mentioned, the relay conductor 4 and the first electrode 101 are connected with solder, and the base conductor 3 and the second electrode 102 are connected with solder, individually, however, a connection method other than solder such as brazed joint may be used. Further, the relay conductor 4 and the noise reduction capacitor 6 may be mounted in the semiconductor module so as to be integrated.

According to the configuration of Embodiment 1, by multi-layering an electrode of the noise reduction capacitor 6, a capacitance of the noise reduction capacitor 6 can be increased with small occupying area, on a surface of the noise reduction capacitor 6, the relay conductor 4 and the base conductor 3 are directly connected. By doing the above-mentioned, the noise reduction capacitor 6 without a lead wire can be connected in the immediate vicinity of the semiconductor module 1. When FIG. 1 is referred, the noise reduction capacitors 6a to 6f are mounted in the immediate vicinity of semiconductor elements 95a to 95c and 96a to 96c, individually.

From a view point of noise reduction function, the noise reduction capacitor 6 does not have a lead wire, therefore, noise can be effectively reduced without being affected by inductance of a lead wire. Conventionally, there are components of a capacitor which do not have a lead wire, such as chip capacitor, however, conventional chip capacitors generally have a first external electrode which electrically connects the first electrodes which are multi-layered each other and a second external electrode which electrically connects the second electrodes which are multi-layered each other, and the external electrodes are arranged on a surface which is perpendicular to the first electrode and the second electrode. The external electrodes are exposed to outside, however, the first electrode and the second electrode which are multi-layered are covered with an insulator, therefore, they are not exposed to outside. The external electrodes are arranged on a surface which is perpendicular to the first electrode and the second electrode, therefore, when an electrode area is increased so as to increase capacitor capacity, the distance between the first external electrode and the second external electrode is far, inductance is increased, consequently, there is a problem such that noise reduction function is decreased. According to the noise reduction capacitor 6 of this invention, the first electrode and the second electrode are alternately layered so as to make a plurality of layers, the outermost of the first electrode is exposed to one surface and functions as the first external electrode, and the outermost of the second electrode is exposed to another surface and functions as the second external electrode. The external electrodes are parallel to the first electrode and the second electrode, therefore, even when an electrode area is increased so as to increase capacitor capacity, the distance between external electrodes is not far, consequently, inductance is not increased. Consequently, in comparison with conventional capacitor components, such as a chip capacitor, etc., which do not have a lead wire, inductance can be decreased and noise reduction function can be improved.

From a view point of cooling performance, the noise reduction capacitor 6 is flat plate-shaped, and thermal resistance in a thickness direction is small, and is directly face-joined to the relay conductor 4 and the base conductor 3 which also functions as a heat radiator. Consequently, the relay conductor 4 can be effectively cooled and temperature increase of the smoothing capacitor 2 can be suppressed. Conventionally, there are heat radiating members which radiate heat by face-joining a heating member and a heat radiator such as thermal conductive sheet, however, regarding the noise reduction capacitor 6 according to this invention, an electrode (such as copper) having smaller thermal resistance than that of an insulator such as a thermal conductive sheet is provided inside, and further the first electrodes 101 are alternately connected inside each other, and the second electrodes 102 are alternately connected inside each other. Consequently, in comparison with conventional heat radiating members which do not have an electrode inside, thermal resistance can be decreased by providing a cooling path having small thermal resistance via an electrode, consequently, cooling function can be improved.

Further, regarding the noise reduction capacitor according to this invention, in order to secure cooling capacity, it is preferable for the first electrode 101 to have an area which is 50 mm² or more per one layer, and the first electrode 101 is flat plate-shaped having a ratio of thickness with respect to the area is 0.02 mm/mm² or less. As above mentioned, the noise reduction capacitor 6 has both a noise reduction function and a cooling function for the relay conductor 4, and a noise reduction function and a cooling function are improved in comparison with conventional capacitor components and heat radiating members, consequently, it is not necessary to provide a heat radiating member for the relay conductor 4 in addition to the noise reduction capacitor 6. Consequently, a size of a device can be decreased.

Embodiment 2

Figure 10:
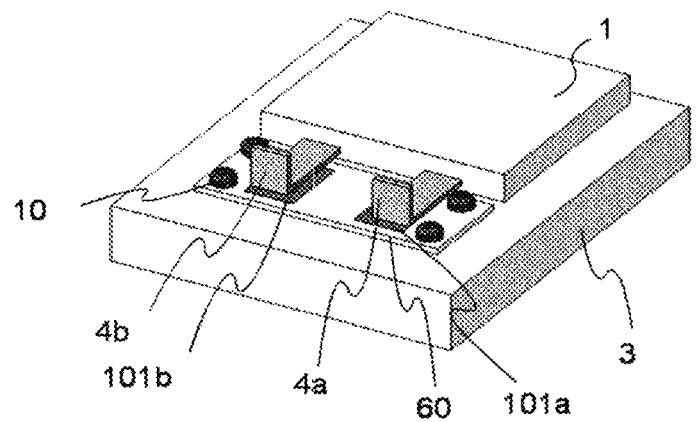
FIG. 10 is a perspective view showing one example of the configuration of a power converter, whose one part is omitted, according to Embodiment 2 of this invention.
Figure 11:
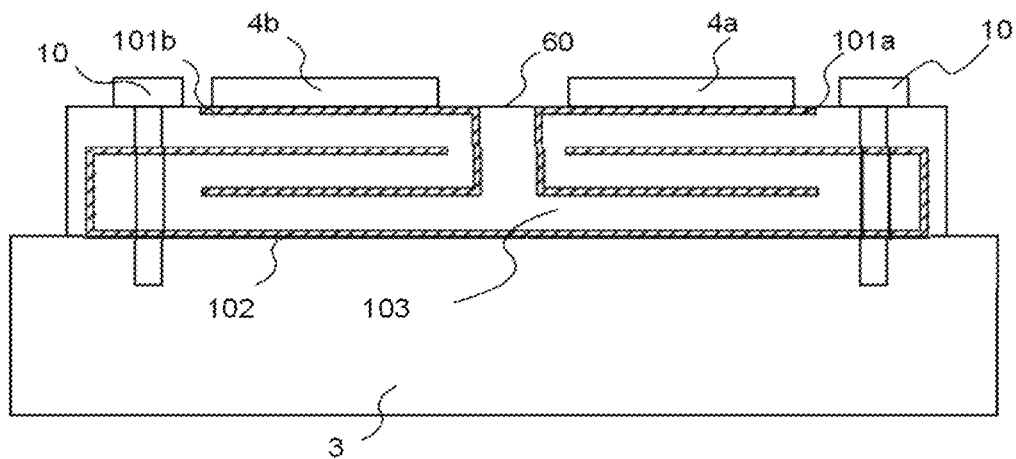
FIG. 11 is a section view showing one example of a noise reduction capacitor of a power converter, at a position of a noise reduction capacitor, according to Embodiment 2 of this invention.

Next, a power converter according to Embodiment 2 will be described. FIG. 10 is a perspective view showing the state in which a noise reduction capacitor is mounted on a power converter. FIG. 11 is a schematic section view for describing the inner configuration of a noise reduction capacitor which is mounted in a power converter. A power converter according to Embodiment 2 has basically the same configuration as that of Embodiment 1, however there is a different point such that in a noise reduction capacitor 60 which is made by integrating a positive pole side noise reduction capacitor 6a and a negative pole side noise reduction capacitor 6d shown in a circuit diagram of FIG. 1, a part in which first electrodes 101a and 101b are not arranged is provided, and a hole is made in the part in which the first electrodes 101a and 101b are not arranged, the noise reduction capacitor 60 is fastened and affixed to a base conductor 3 by a screw 10 so as for a second electrode 102 on a bottom surface of the noise reduction capacitor 60 to contact with the base conductor 3.

As above mentioned, at a position where the first electrodes 101a and 101b are not arranged, even when the noise reduction capacitor 60 is fastened and affixed by a screw, an insulator between the first electrodes 101a and 101b, and the second electrode 102 is not pressurized. Therefore, by thinning an insulator 103, electrostatic capacity of the noise reduction capacitor 60 can be increased, noise reduction effect can be improved, thermal resistance of the insulator 103 can be decreased, and cooling performance of relay conductors 4a and 4b can be improved. Here, the noise reduction capacitor 60 has the configuration in which a positive pole side and a negative pole side are integrated, however, as described in Embodiment 1, a positive pole side and a negative pole side may be separated and the positive pole side and the negative pole side may be affixed by a screw, individually.

Embodiment 3

Figure 12:
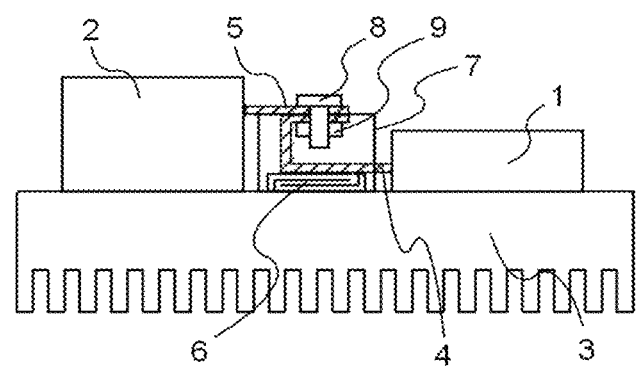
FIG. 12 is a section view showing the configuration of a power converter according to Embodiment 3 of this invention.

Next, a power converter according to Embodiment 3 will be described. FIG. 12 is a schematic section view for describing an inner configuration of a power converter according to Embodiment 3. A power converter according to Embodiment 3 has basically the same configuration as that of Embodiment 1, however there is a different points such that a smoothing capacitor 2 has a smoothing capacitor terminal 5, a relay conductor 4 and the smoothing capacitor terminal 5 are fastened and affixed by a screw 8 and a nut 9. By bending the relay conductor 4 to be a U-shape, and a part where the relay conductor 4 and the smoothing capacitor terminal 5 are fastened and affixed is away from a noise reduction capacitor 6. The relay conductor 4, the noise reduction capacitor 6 and the nut 9 are molded with a resin 7 to be an integrated member.

According to the configuration of Embodiment 3, the smoothing capacitor terminal 5 can be easily detached and attached from the relay conductor 4, as a result, assemblability and maintainability is improved. Further, a part where the relay conductor 4 and the smoothing capacitor terminal 5 are fastened and affixed is away from the noise reduction capacitor 6, therefore pressure which is caused by fastening and affixing is not applied to the noise reduction capacitor 6, consequently, even when an insulator 103 in the noise reduction capacitor is thinned, the insulator 103 will not be degraded. Therefore, by thinning the insulator 103, electrostatic capacity of the noise reduction capacitor 6 is increased, noise reduction effect can be improved, and thermal resistance of the insulator 103 can be decreased and cooling performance of the relay conductor 4 can be improved.

Embodiment 4

Figure 13:
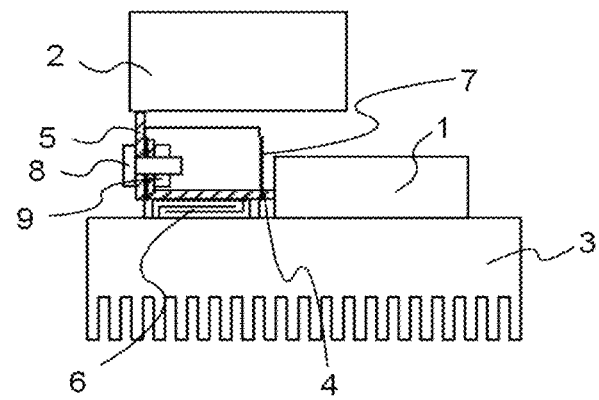
FIG. 13 is a section view showing the configuration of a power converter according to Embodiment 4 of this invention.

Next, a power converter according to Embodiment 4 will be described. FIG. 13 is a schematic section view for describing the inner configuration of a power converter according to Embodiment 4. A power converter according to Embodiment 4 has basically the same configuration as that of Embodiment 3, however there is a different point such that as shown in FIG. 13, a smoothing capacitor 2 is not mounted on a base conductor 3 and is arranged on an upper part of a semiconductor module 1, and by bending a relay conductor 4 so as to form an L-shape, a part where the relay conductor 4 and a smoothing capacitor terminal 5 are fastened and affixed is far away from a noise reduction capacitor 6. As above mentioned, even in a case where the smoothing capacitor 2 is not mounted on the base conductor 3, the effect which is same as the effect which can be obtained by Embodiment 3 can be obtained.

Embodiment 5

Figure 14:
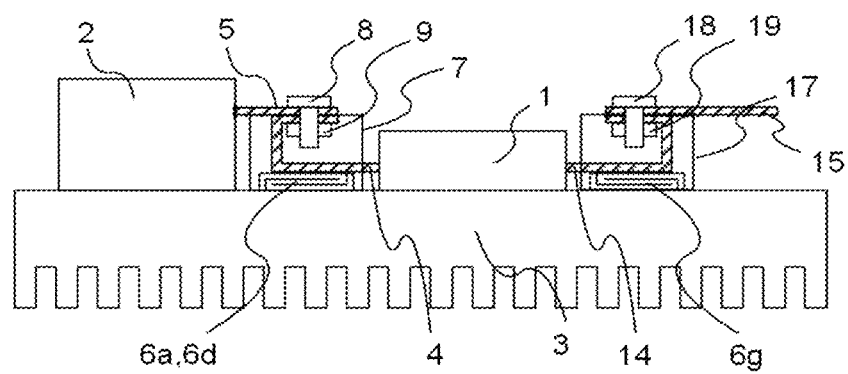
FIG. 14 is a section view showing the configuration of a power converter according to Embodiment 5 of this invention.
Figure 15:
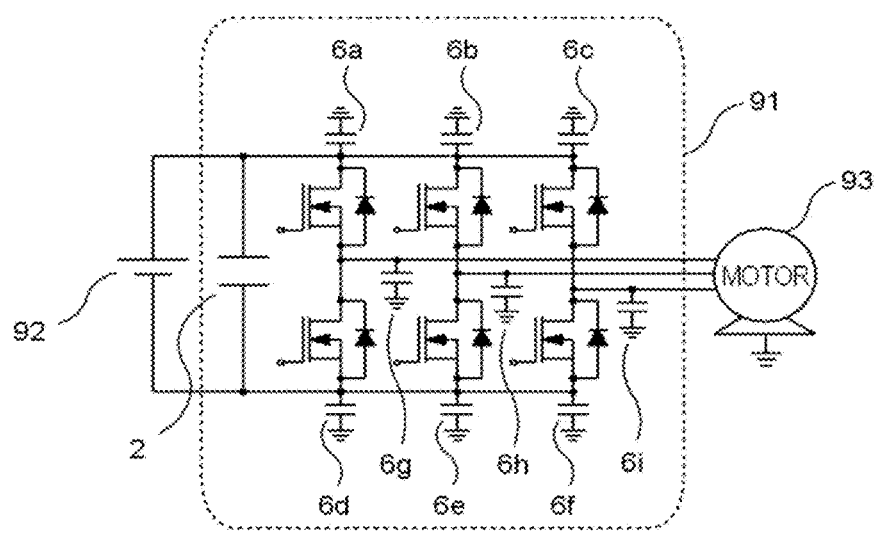
FIG. 15 is a schematic circuit diagram showing one example of a power converter according to Embodiment 5 of this invention.

Next, a power converter according to Embodiment 5 will be described. FIG. 14 is a schematic section view for describing the inner configuration of a power converter according to Embodiment 5. FIG. 15 is a circuit diagram for describing the configuration of a power converter 91 according to Embodiment 5. A power converter according to Embodiment 5 has basically the same configuration as that of Embodiment 3, however there is a different point such that as shown in FIG. 15, not only at a positive pole side and a negative pole side of the power converter 91, but also at a motor side, noise reduction capacitors 6g, 6h and 6i are provided. When the mounting configuration of the motor side noise reduction capacitor 6g is took as an example, concretely, as shown in FIG. 14, a motor side relay conductor 14 which connects a semiconductor module 1 and a motor side conductive member 15 is provided, the motor side relay conductor 14 is connected to a first electrode 101 on an upper surface of the motor side noise reduction capacitor 6g with solder, and the base conductor 3 is connected to a second electrode 102 on a bottom surface of the motor noise reduction capacitor 6g with solder. The motor side relay conductor 14 and the motor side conductive member 15 are fastened and affixed by a screw 18 and a nut 19. By bending the motor side relay conductor 14 to be a U-shape, a part where the motor side relay conductor 14 and the motor side conductive member 15 are fastened and affixed is away from the motor side noise reduction capacitor 6g. The motor side relay conductor 14, the noise reduction capacitor 6g and the nut 19 are molded with a resin 17 to be an integrated member. Here, the motor side conductive member 15 is a cable which connects the power converter 91 and the motor 93 shown in FIG. 15, for example, however, the motor side conductive member 15 may be an inner wiring member of the power converter 91.

According to the configuration of Embodiment 5, not only the noise which is generated from a positive pole side and a negative pole side of the semiconductor module 1 but also the noise which is generated from a motor side of the semiconductor module 1 can be reduced, therefore, noise reduction effect can be improved in comparison with a power converter according to Embodiment 3.

Embodiment 6

Figure 16:
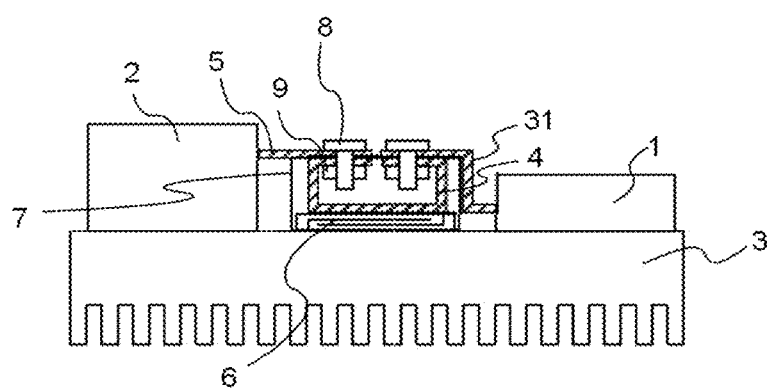
FIG. 16 is a section view showing the configuration of a power converter according to Embodiment 6 of this invention.

Next, a power converter according to Embodiment 6 will be described. FIG. 16 is a schematic section view for describing the inner configuration of a power converter according to Embodiment 6. A power converter according to Embodiment 6 has basically the same configuration as that of Embodiment 3, however there is a different point such that a semiconductor module 1 has a semiconductor module terminal 31, a first electrode 101 on an upper surface of a noise reduction capacitor 6 is connected to a relay conductor 4 with solder, by bending both ends of the relay conductor 4 to be an U-shape, one end of the relay conductor 4 and a smoothing capacitor terminal 5 are fastened and affixed, and another end of the relay conductor 4 and a semiconductor module terminal 31 are fastened and affixed, and a part where the relay conductor 4 and the smoothing capacitor terminal 5 are fastened and affixed and a part where the relay conductor 4 and the semiconductor module terminal 31 are fastened and affixed are away from the noise reduction capacitor 6.

According to Embodiment 6, the semiconductor module terminal 31 can be easily detached and attached from the relay conductor 4, as a result, assemblability and maintainability is improved.

Embodiment 7

Figure 17:
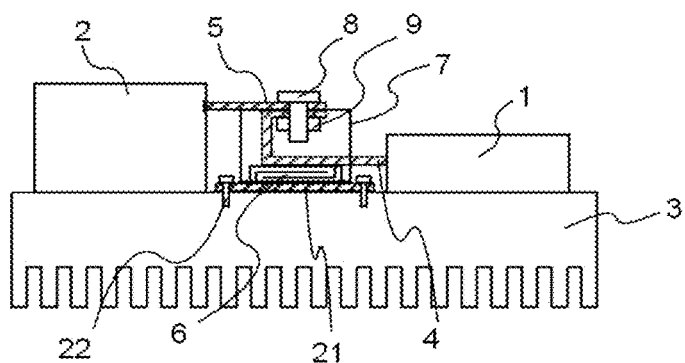
FIG. 17 is a section view showing the configuration of a power converter according to Embodiment 7 of this invention.
Figure 18:
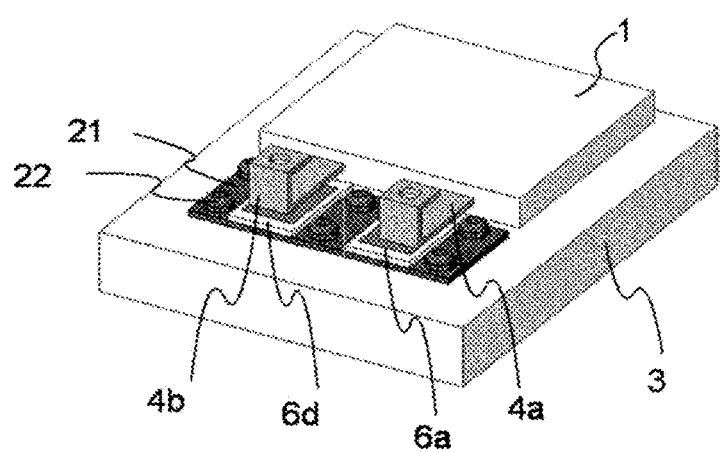
FIG. 18 is a perspective view showing one example of the configuration of a power converter, whose one part is omitted, according to Embodiment 7 of this invention.

Next, a power converter according to Embodiment 7 will be described. FIG. 17 is a schematic section view for describing the inner configuration of a power converter according to Embodiment 7. FIG. 18 is a perspective view showing the state in which a noise reduction capacitor is mounted on a power converter. In order to make FIG. 18 easy to visually see, a smoothing capacitor 2, a smoothing capacitor terminal 5, a screw 8, a nut 9 and a resin 7 are omitted and depicted. A power converter according to Embodiment 7 has basically the same configuration as that of Embodiment 3, however there is a different point such that as shown in FIGS. 17 and 18, a second electrode 102 on a bottom surface of a noise reduction capacitor 6 and a conductive board 21 are connected with solder, and the conductive board 21 and a base conductor 3 are fastened and affixed by screws 22. Here, the second electrode 102 and the conductive board 21 are connected with solder, however, a connection method other than solder such as brazed joint may be used. Further, in a case where a surface of the conductive board 21 and that of a base conductor 3 are rough, and minute gap is generated where the conductive board 21 and the base conductor 3 are connected so as to decrease the heat radiating performance, heat radiation member such as a thermal conductive grease may be applied between the conductive board 21 and the base conductor 3 so as not to decrease the heat radiating performance. By constituting the above mentioned, the second electrode 102 in an outermost layer and the base conductor 3 are indirectly face-joined.

According to the configuration of Embodiment 7, together with the conductive board 21, the noise reduction capacitor 6 can be easily detached and attached from the base conductor 3, as a result, assemblability and maintainability is improved.

Embodiment 8

Figure 19:
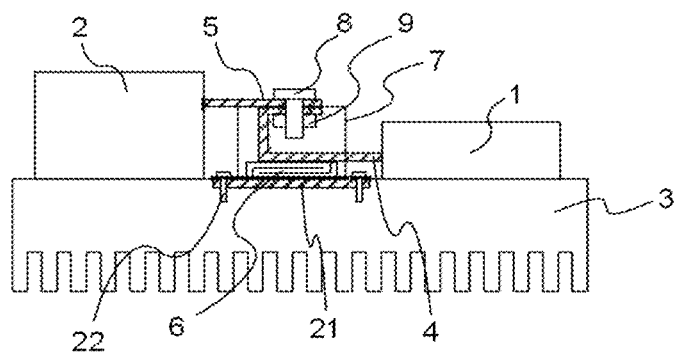
FIG. 19 is a section view showing the configuration of a power converter according to Embodiment 8 of this invention.

Next, a power converter according to Embodiment 8 will be described. FIG. 19 is a schematic section view for describing the inner configuration of a power converter according to Embodiment 8. A power converter according to Embodiment 8 has basically the same configuration as that of Embodiment 7, however there is a different point such that a conductive board 21 is imbedded in a base conductor 3.

According to the configuration of Embodiment 8, inductance of a thickness of the conductive board 21 can be decreased, therefore, noise reduction effect can be improved. Further, a size and a height can be decreased.

Embodiment 9

Figure 20:
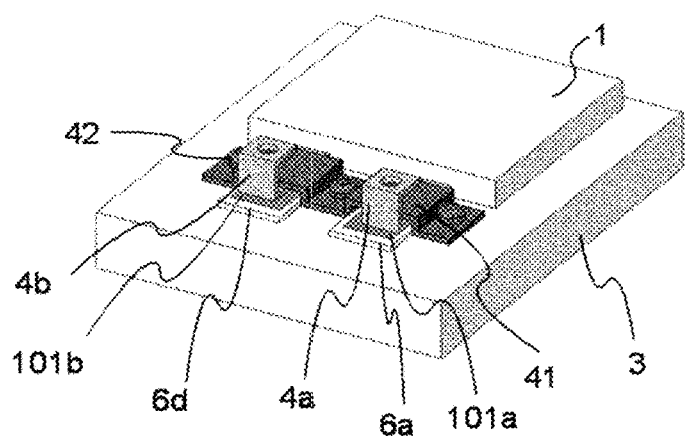
FIG. 20 is a perspective view showing one example of the configuration of a power converter, whose one part is omitted, according to Embodiment 9 of this invention.

Next, a power converter according to Embodiment 9 will be described. FIG. 20 is a perspective view showing the state in which a noise reduction capacitor is mounted on a power converter according to Embodiment 9. A power converter according to Embodiment 9 has basically the same configuration as that of Embodiment 3, however there is a different point such that a shielding member 41 for covering a part where a positive pole side first electrode 101a on an upper surface of a positive pole side noise reduction capacitor 6a and a positive pole side relay conductor 4a are connected and a part where a negative pole side first electrode 101b on an upper surface of a negative pole side noise reduction capacitor 6d and a negative pole side relay conductor 4b are connected is provided, and the shielding member 41 is fastened and affixed to a base conductor 3 by screws. As described in Embodiments 7 and 8, a conductive board may be provided so as to affix the shielding member 41 to the conductive board by screws.

According to the configuration of Embodiment 9, by covering the periphery of the relay conductor 4 with the base conductor 3 and the shielding member 41, inductance of the relay conductor 4 can be decreased and noise reduction effect can be improved.

Embodiment 10

Figure 21:
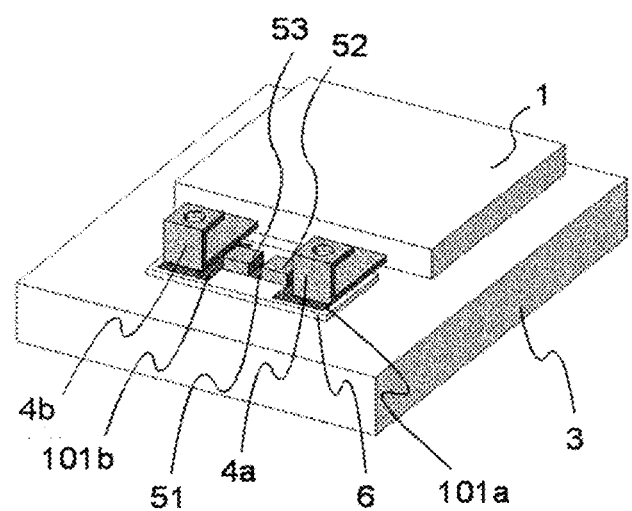
FIG. 21 is a perspective view showing one example of the configuration of a power converter, whose one part is omitted, according to Embodiment 10 of this invention.
Figure 22:
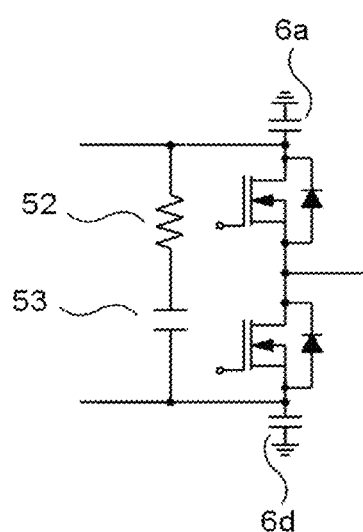
FIG. 22 is a schematic circuit diagram showing one example of a power converter according to Embodiment 10 of this invention.

Next, a power converter according to Embodiment 10 will be described. FIG. 21 is a perspective view showing the state in which a noise reduction capacitor is mounted on a power converter according to Embodiment 10. FIG. 22 is a circuit diagram for describing the configuration of a power converter according to Embodiment 10. A power converter according to Embodiment 10 has basically the same configuration as that of Embodiment 3, however there is a different point such that in the same way as that of Embodiment 2, a positive pole side noise reduction capacitor 6 and a negative pole side noise reduction capacitor 6 are integrated, in an upper surface of the noise reduction capacitor 6, at a part where a positive pole side first electrode 101a and a negative pole side first electrode 101b are not arranged, a snubber component mounting electrode 51 is provided, a snubber resistance 52 is connected to the positive pole side first electrode 101a on an upper surface of the noise reduction capacitor 6 with solder and the snubber component mounting electrode 51 with solder, and a snubber capacitor 53 is connected to the negative pole side first electrode 101b on an upper surface of the noise reduction capacitor 6 and the snubber component mounting electrode 51 with solder. The above-mentioned configuration is shown in FIG. 22 as a circuit diagram.

Here, the snubber resistance 52 and the snubber capacitor 53 are not directly connected, and are connected via the snubber component mounting electrode 51, however, without providing the snubber component mounting electrode 51, the snubber resistance 52 and the snubber capacitor 53 may be directly connected. Further, the snubber resistance 52 and the snubber capacitor 53 are connected to the first electrodes 101a and 101b, however, they may be directly connected to relay conductors 4a and 4b. Further, the snubber resistance 52 is arranged at a positive pole side and the snubber capacitor 53 is arranged at a negative pole side, however, the snubber resistance 52 may be arranged at a negative pole side and the snubber capacitor 53 may be arranged at a positive pole side. Further, when the resistance value of the snubber resistance 52 is set to be 0Ω, without using the snubber resistance 52 and without providing the snubber component mounting electrode 51, only the snubber capacitor 53 may be connected to the positive pole side first electrodes 101a and 101b.

Generally, when a snubber circuit comprising the snubber resistance 52 and the snubber capacitor 53 is away from a semiconductor module which is a noise source, noise reduction effect reduces, however, according to the configuration of Embodiment 10, snubber parts such as the snubber resistance 52 and the snubber capacitor 53 can be mounted in the immediate vicinity of the semiconductor module 1, therefore, noise reduction effect can be improved, consequently, it is not necessary to provide a substrate for mounting the snubber resistance 52 and the snubber capacitor 53 separately, as a result, a size of a device can be reduced.

Embodiment 11

Figure 23:
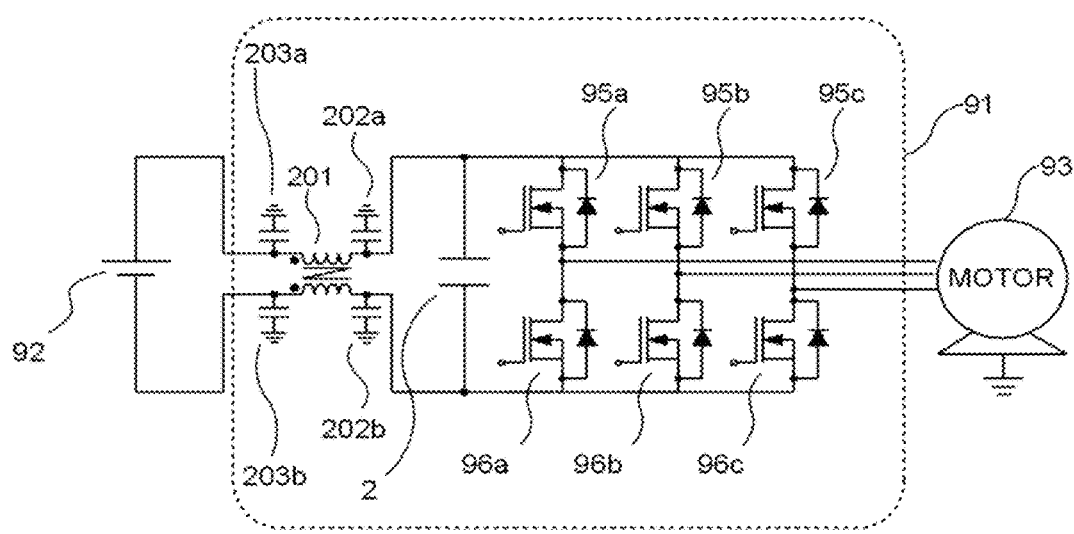
FIG. 23 is a schematic circuit diagram showing one example of a power converter according to Embodiment 11 of this invention.
Figure 24:
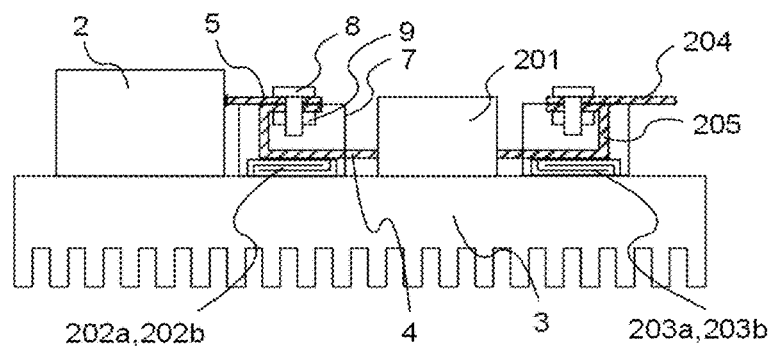
FIG. 24 is a section view showing the configuration of a power converter according to Embodiment 11 of this invention.

Next, a power converter according to Embodiment 11 will be described. FIG. 23 is a circuit diagram for describing the configuration of a power converter 91 according to Embodiment 11. FIG. 24 is a schematic section view for describing the inner configuration of a power converter according to Embodiment 11. A power converter according to Embodiment 11 has basically the same configuration as that of Embodiment 3, however there is a different point such that a common mode coil 201 for reducing noise is provided at a positive pole and a negative pole, and in the immediate vicinity of the common mode coil 201, noise reduction capacitors 202 and 203 are provided. The configuration of a positive pole side noise reduction capacitor 202a is same as that of a negative pole side noise reduction capacitor 202b, and the configuration of a positive pole side noise reduction capacitor 203a is same as that of a negative pole side noise reduction capacitor 203b, individually, therefore, in a section view of FIG. 24, only one of the noise reduction capacitors 202a and 202b is shown, and only one of the noise reduction capacitors 203a and 203b is shown. A common mode coil refer to two windings which are formed at a positive pole and a negative pole in a single magnetic substance, in a case where a flow of an electric current in a positive pole is opposite to that in a negative pole, magnetic flux is canceled each other in a magnetic substance so as to generate a small inductance, and in a case where a flow of an electric current in a positive pole is same as that in a negative pole, magnetic flux is strengthened each other in a magnetic substance so as to generate large inductance. Here, a common mode coil are used, however, coils which are wounded around magnetic substances separately at a positive pole and a negative pole may be used.

As shown in FIG. 24, the common mode coil 201 and a smoothing capacitor 2 are mounted on a base conductor 3 which also functions as a heat radiator, by a relay conductor 4, the common mode coil 201 and the smoothing capacitor 2 are connected. The relay conductor 4 is connected to a first electrode 101 on an upper surface of the noise reduction capacitor 202 with solder, and the base conductor 3 is connected to the second electrode 102 on a bottom surface of the noise reduction capacitor 202 with solder. The relay conductor 4 and a smoothing capacitor terminal 5 are fastened and affixed by a screw 8 and a nut 9. By bending the relay conductor 4 to be a U-shape, a part where the relay conductor and the smoothing capacitor terminal 5 are fastened and affixed is away from a part where the relay conductor 4 and the first electrode on an upper surface of the noise reduction capacitor 202 are connected. The relay conductor 4, the noise reduction capacitor 202 and the nut 9 are molded with a resin 7 to be an integrated member. The configuration of the common mode coil 201 at a side of a direct current power source 92 is same as the above-mentioned and has the noise reduction capacitor 203, and a power source side relay conductor 205 and a power source side conductive member 204 are fastened and affixed by a screw. Here, the power source side conductive member 204 refers to a cable which connects the power converter 91 and the direct current power source 92 in FIG. 23, for example, however, the power source side conductive member 204 may be inner wiring member of the power converter 91.

Next, an effect which is obtained in Embodiment 11 will be described. In Embodiments 1 to 10, a source of heating is the semiconductor module 1, however, in a case where the common mode coil 201 is used so as to decrease noise which is generated by a power converter, the common mode coil 201 also generates heat due to loss by Joulian heat when power is applied and heat is transferred to the smoothing capacitor 2, therefore, there is a problem such that a temperature of the smoothing capacitor 2 is increased. According to the configuration of Embodiment 11, noise reduction capacitors 202 and 203 without lead wires can be connected in the intermediate vicinity of the common mode coil 201 which is a source of heating, therefore generating of heat of the common mode coil 201 can be effectively cooled and noise reduction performance due to the common mode coil 201 can be improved.

In Embodiment 11, noise reduction capacitors 202 and 203 are provided at all terminals of the common mode coil 201, however, only by using one of the noise reduction capacitor 202 and 203, the common mode coil 201 can be cooled. Further, regarding the packaging configuration of noise reduction capacitors 202 and 203, all of packaging configurations which are described in Embodiments 1 to 10 can be applied.

Embodiment 12

Figure 25:
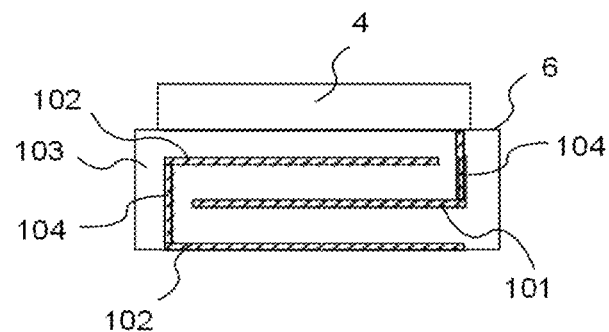
FIG. 25 is a section view showing one example of the configuration of a noise reduction capacitor of a power converter according to Embodiment 12 of this invention.

Next, a power converter according to Embodiment 12 will be described. FIG. 25 is a schematic section view for describing one example of the configuration of a noise reduction capacitor of a power converter according to Embodiment 12. A power converter according to Embodiment 12 has basically the same configuration as that of Embodiment 1, however there is a different point such that a relay conductor 4 is arranged on an upper surface of a noise reduction capacitor 6 so as to function also as a first electrode in an outermost layer. By an interlayer connection conductor 104, the relay conductor 4 is electrically connected to a first electrode 101 in the noise reduction capacitor 6.

According to the configuration of Embodiment 12, thermal resistance of a face-joining part between the relay conductor 4 and the first electrode which is arranged on an upper surface of the noise reduction capacitor 6 is reduced, and cooling performance of the relay conductor 4 can be improved. Further, the configuration of a noise reduction capacitor according to Embodiment 12 can be applied to all of packaging configurations which are described in Embodiments 1 to 11 can be applied.

Embodiment 13

Figure 26:
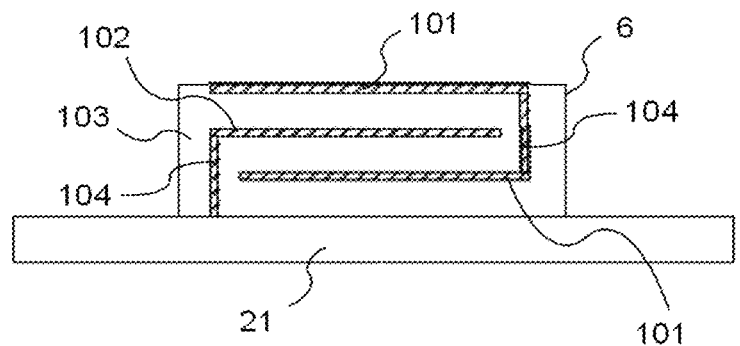
FIG. 26 is a section view showing one example of the configuration of a noise reduction capacitor of a power converter according to Embodiment 12 of this invention.

Next, a power converter according to Embodiment 13 will be described. FIG. 26 is a schematic section view for describing one example of the configuration of a noise reduction capacitor of a power converter according to Embodiment 13. A power converter according to Embodiment 13 has basically the same configuration as that of Embodiment 7, however there is a different point such that a conductive board 21 which is fixed to a base conductor constitutes a second electrode which is arranged on a bottom surface, that is, a second electrode in an outermost layer. By an interlayer connection conductor 104, the conductive board 21 is electrically connected to a second electrode 102 in the noise reduction capacitor 6.

According to the configuration of Embodiment 13, thermal resistance of a face-joining part between the conductive board 21 and the second electrode which is arranged on a bottom surface of the noise reduction capacitor 6 is reduced, and cooling performance of the relay conductor 4 can be improved.

As above mentioned in all embodiments, this invention can be applied to a power converter which has a source of heating power which generates heat due to loss of electricity such as a semiconductor module and a coil, that is, an electrically heat generating member.

This invention is not limited to the configuration and operation of each embodiment which are described in the above, within the range of this invention, mode of each embodiment may be appropriately changed or omitted.

REFERENCE 1. semiconductor module (electrically heating member)
2. smoothing capacitor
3. base conductor
4. relay conductor
4a. positive pole side relay conductor
4b. negative pole side relay conductor
6. noise reduction capacitor
6a, 6b, 6c. positive pole side noise reduction capacitor
6d, 6e, 6f. negative pole side noise reduction capacitor
6g, 6h, 6i. motor side noise reduction capacitor
14. motor side relay conductor
21. conductive board
52. snubber resistance
53. snubber capacitor
91. power converter
93. motor
95, 95a, 95b, 95c, 95d, 95e, 95f. semiconductor element of an upper arm
96, 96a, 96b, 96c, 96d, 96e, 96f semiconductor element of a lower arm
101. first electrode
101a. positive pole side first electrode
101b. negative pole side first electrode
102. second electrode
102a. positive pole side second electrode
102b. negative pole side second electrode
103. insulator
201. common mode coil (electrically heating member)
202a, 202b, 203a, 203b noise reduction capacitor

The invention claimed is:

1. A power converter comprising a base conductor, an electrically heating member which is provided on the base conductor, at least one noise reduction capacitor of flat plate-shape in which via an insulator, a plurality of first electrodes and second electrodes are alternately layered, on one surface, the first electrode in an outermost layer is exposed and on another surface, the second electrode in an outermost layer is exposed, and a at least one relay conductor of plate-shape which is electrically connected to the base conductor via the noise reduction capacitor, wherein the noise reduction capacitor is sandwiched between the base conductor and the relay conductor with the second electrode in an outermost layer of the noise reduction capacitor being directly face-joined to a face of the base conductor at a side where the electrically heating member is provided so as to be affixed to the base conductor, and the first electrode in an outermost layer of the noise reduction capacitor and the relay conductor being face-joined.

2. The power converter according to claim 1, wherein the electrically heating member is a semiconductor module.

3. The power converter according to claim 1, wherein the electrically heating member is a coil.

4. The power converter according to claim 1, wherein a conductive board which is affixed to the base conductor is provided, by face-joining.

5. The power converter according to claim 1, wherein a conductive board which is affixed to the base conductor is provided, the conductive board constitutes the second electrode in the outermost layer.

6. The power converter according to claim 1, wherein instead of face-joining the first electrode in the outermost layer and the relay conductor, the relay conductor also functions as the first electrode in the outermost layer.

7. The power converter according to claim 2, wherein the semiconductor module comprises a positive pole side semiconductor element and a negative pole side semiconductor element which constitute a semi-bridge circuit which is connected to a power converter circuit, wherein each of the at least one relay conductor is connected to a positive pole side terminal of the positive pole side semiconductor and a negative pole side terminal of the negative pole side semiconductor, individually, and wherein each of the at least one noise reduction capacitor is individually connected to a respective relay conductor, and a snubber component is connected between each of the noise reduction capacitors or between each of the relay conductors.

8. The power converter according to claim 2, wherein a semiconductor element which is provided in the semiconductor module is formed of wide bandgap semiconductor.

9. The power converter according to claim 8, wherein the wide bandgap semiconductor is a semiconductor selecting from silicon carbide, a gallium nitride based material and diamond.

\* \* \* \* \*